US006369323B1

(12) United States Patent
Wright

(10) Patent No.: US 6,369,323 B1
(45) Date of Patent: Apr. 9, 2002

(54) NON-METALLIC OUTLET BOX HAVING A GROUND STRAP WITH PLURAL GROUND SCREWS

(75) Inventor: Ronald D. Wright, Byhalia, MS (US)

(73) Assignee: Thomas & Betts International, Inc., Sparks, NV (US)

(*) Notice: Subject to any disclaimer, the term of this patent is extended or adjusted under 35 U.S.C. 154(b) by 0 days.

(21) Appl. No.: 09/602,681

(22) Filed: Jun. 26, 2000

Related U.S. Application Data

(60) Provisional application No. 60/142,286, filed on Jul. 2, 1999.

(51) Int. Cl.[7] .................................................. H05K 5/02

(52) U.S. Cl. ........................ 174/51; 174/40 CC; 439/98

(58) Field of Search .............................. 174/51, 40 CC, 174/135, 53, 6, 35 R, 78; 439/98, 100, 92, 108, 97; 361/799, 753

(56) References Cited

U.S. PATENT DOCUMENTS 948,438 A 2/1910 Ziegler et al.
1,112,426 A 9/1914 Stoddard
1,772,241 A 8/1930 Calderwood
1,809,840 A 6/1931 Fullman
1,820,626 A 8/1931 Newman et al.
1,857,787 A 5/1932 Meeks et al.
2,051,129 A 8/1936 Clayton
2,329,109 A 9/1943 Despard
2,686,065 A 8/1954 Bergquist
2,757,817 A 8/1956 Egan
3,084,958 A 4/1963 Appleton
3,210,458 A * 10/1965 Palmer ..................... 174/53 X
3,491,974 A 1/1970 Swanquist
3,575,313 A 4/1971 Trachtenberg et al.
4,012,580 A 3/1977 Arnold
4,082,915 A * 4/1978 Silver .......................... 174/51
4,202,457 A 5/1980 Tansi
4,263,472 A 4/1981 Maheu
4,580,689 A 4/1986 Slater
4,666,055 A 5/1987 Lewis
4,706,831 A 11/1987 Williams, Jr.
4,889,453 A 12/1989 Micco et al.
5,574,255 A 11/1996 Simmons
5,831,213 A 11/1998 Wright et al.
5,932,844 A 8/1999 MacAller et al.
6,011,218 A * 1/2000 Burek et al. ............ 174/135 X
6,118,071 A * 9/2000 Munch et al. .............. 174/6 X
6,239,365 B1 * 5/2001 McEvers ..................... 174/50

FOREIGN PATENT DOCUMENTS

GB 2212004 * 7/1989 .................. 174/51
JP 406006065 * 1/1994 .................. 174/51

* cited by examiner

*Primary Examiner*—Dean A. Reichard
*Assistant Examiner*—Dhiru R Patel
(74) *Attorney, Agent, or Firm*—Hoffman & Baron, LLP

(57) ABSTRACT

The electrical outlet box assembly accommodates an electrical termination device. A non-metallic outlet box housing includes a back wall and a perimetrical side wall with an open front face defining a box interior. A metallic ground strap is supported by the housing within the box interior. The ground strap includes an elongate portion including a pair of spaced apart mounting members in electrical continuity through the elongate portion. The mounting members are positioned to accommodate a ground wire of the electrical termination device.

5 Claims, 4 Drawing Sheets

NON-METALLIC OUTLET BOX HAVING A GROUND STRAP WITH PLURAL GROUND SCREWS

This application claims the benefit of U.S. Provisional Application No. 60/142,286, filed on Jul. 2, 1999.

FIELD OF THE INVENTION

The present invention relates generally to an electrical outlet box for housing termination devices such as switches and receptacles. More particularly, the present invention relates to a non-metallic outlet box including a ground strap having a pair of ground screws thereon to accommodate the ground wires in the outlet box.

BACKGROUND OF THE INVENTION

In terminating electrical conductors to termination devices such as switches, receptacles, ground fault circuit interrupters (GFI) and the like, terminations are typically supported within an electrical outlet box. The outlet box supports and encloses the termination device as well as the wires which are to be terminated thereto. All of the devices housed within the outlet box must be grounded. This requires a wire to be attached from the termination to a portion of the box which is attached to a ground conductor of the power wires fed to the box. With metal boxes, grounding may be accomplished by attaching the wire from the termination to the metal box which is itself attached to the ground conductor. With non-metallic plastic boxes however, a metallic ground strap must be provided within the box. The ground strap is connected to the ground conductor of the power wires fed to the box. Ground wires of the termination device may be attached to the ground strap in order to effect ground continuation between the ground wire and the device.

Typically, the ground straps are provided with a single screw. This ground screw would attach both the ground conductor of the power wires and the ground wire of the termination device. In certain situations where multiple termination devices are supported within a box, it is difficult to individually connect plural wires to a single screw. In addition, in certain situations, the power line is continued from one outlet box to another. In order to continue the ground wire from one box to the next, the ground screw must be undone and a new line must be attached to or continue the power to the next location. As may be appreciated, all of the grounding terminations may not be adequately accommodated by a single ground screw. Further, in prior boxes the single ground screw may be located next to the lip of the box making it difficult to terminate plural ground wires thereto.

SUMMARY OF THE INVENTION

It is, therefore, an object of the present invention to provide an electrical outlet box for accommodating termination devices, where the termination devices may be grounded in the box.

It is a further object of the present invention to provide non-metallic outlet box for accommodating a termination device such as a switch or receptacle. The non-metallic box supports a metallic ground strap for permitting ground connection.

It is still further object of the present invention to provide an outlet box for accommodating termination devices such as switches or receptacles which provides a ground strap having a pair spaced apart mounting members for accommodating ground wire of the termination device.

In the efficient attainment of these and other objects, the present invention provides an electrical outlet box for accommodating electrical termination device. The outlet box includes a non-metallic outlet box housing having a back wall and a perimetrical side wall with an open front face defining a box interior. A metallic ground strap is supported by the housing within the box interior. The ground strap has an elongate portion including spaced apart mounting members in electrical continuity through the elongate portion. The mounting members are positioned to accommodate ground wires extending from the electrical termination device.

As more fully described in the preferred embodiment herein, the ground strap is an L-shaped member including a first leg supported on the back wall of the outlet box, and a second leg supported on the sidewall. The first leg of the ground strap includes a pair of spaced apart internally threaded apertures which accommodate ground screws. The outlet box assembly of the present invention permits the wires to be connected to the various ground screws thereby placing the wires in ground continuity without the need to attach the wires to the same ground screw.

DESCRIPTION OF THE PREFERRED EMBODIMENTS

Figure 1:
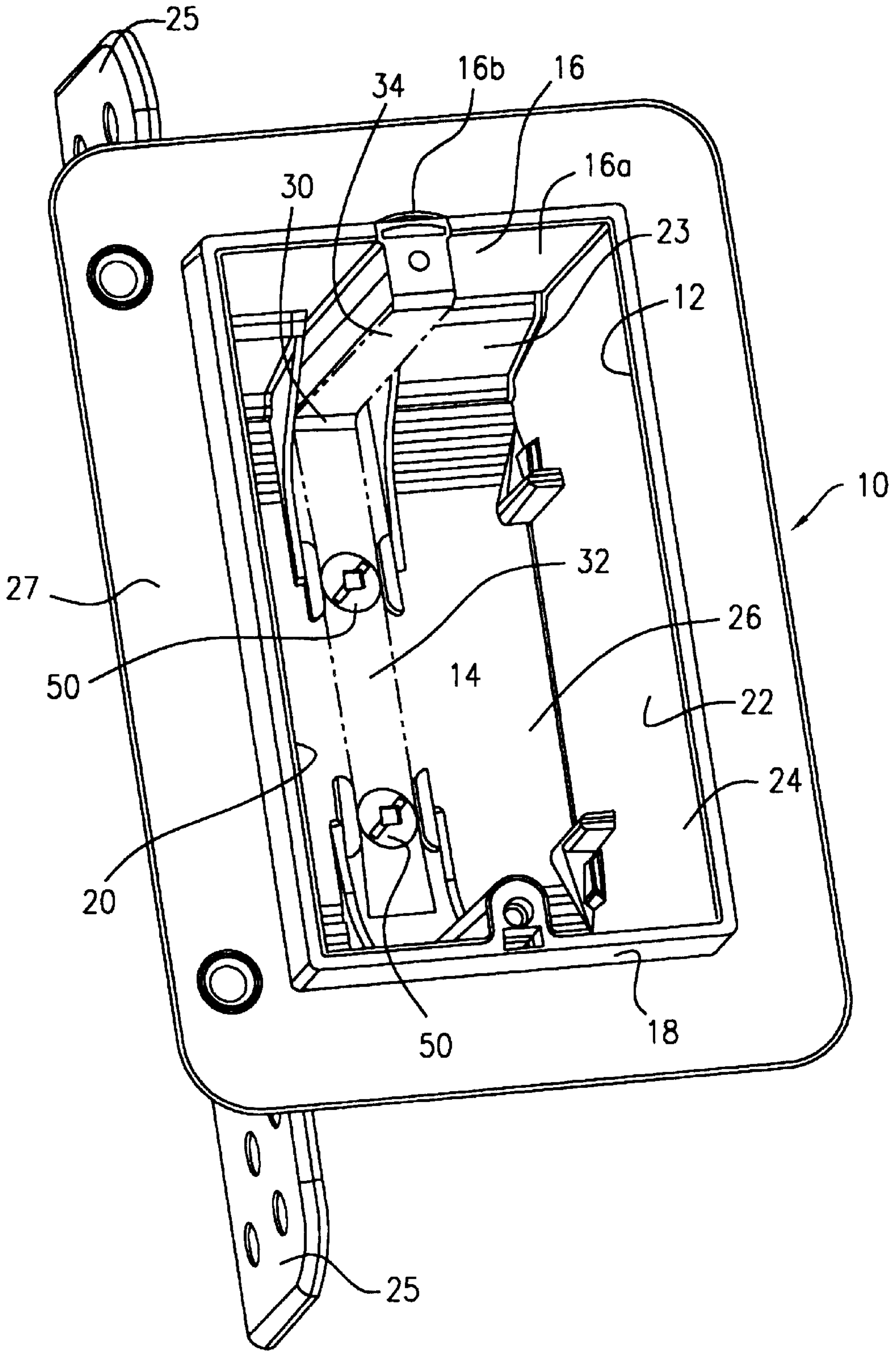
FIG. 1 is a front perspective showing of the outlet box assembly of the present invention.
Figure 2:
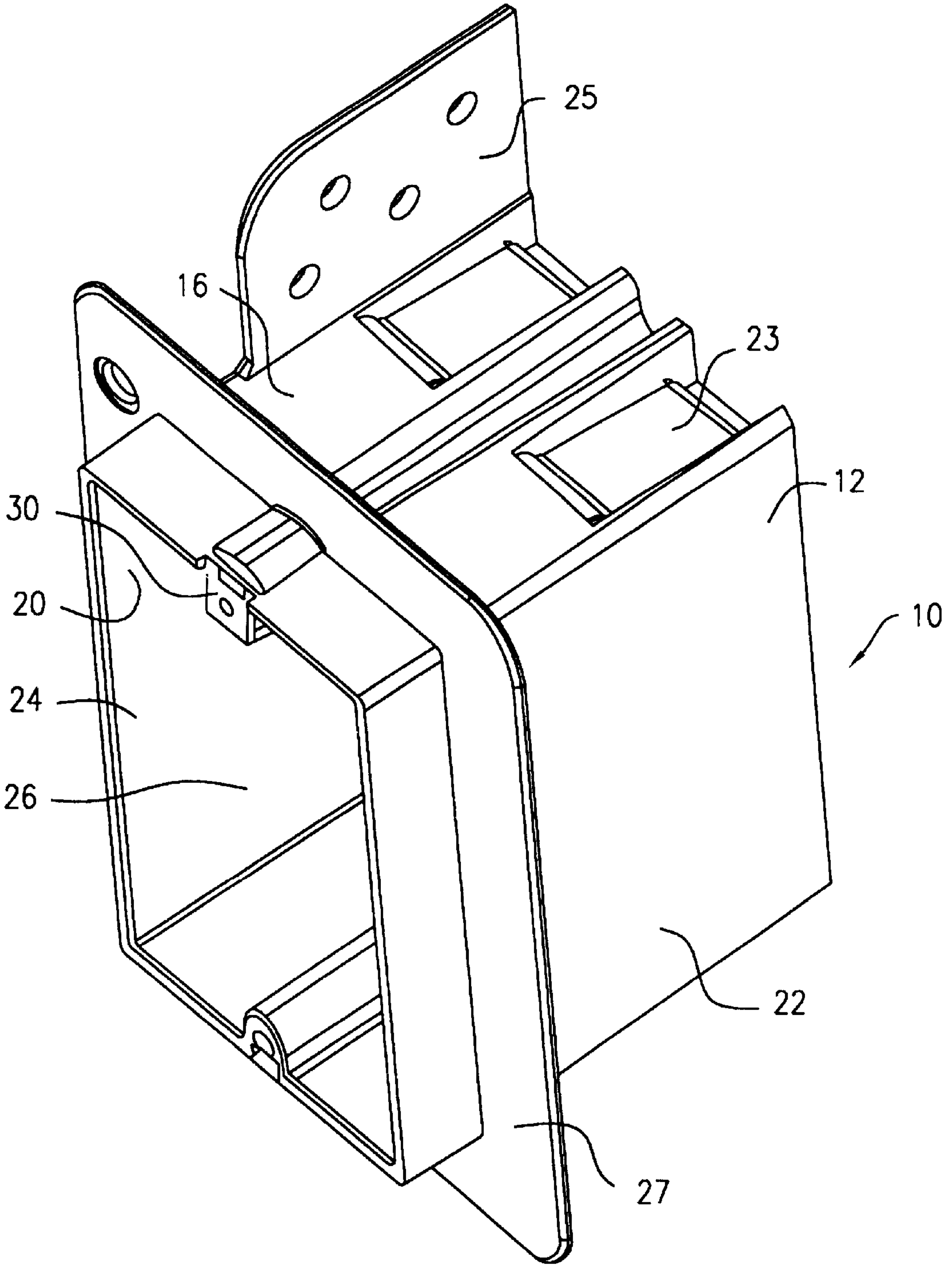
FIG. 2 is a top perspective showing of the outlet box of the assembly of FIG. 1.
Figure 3:
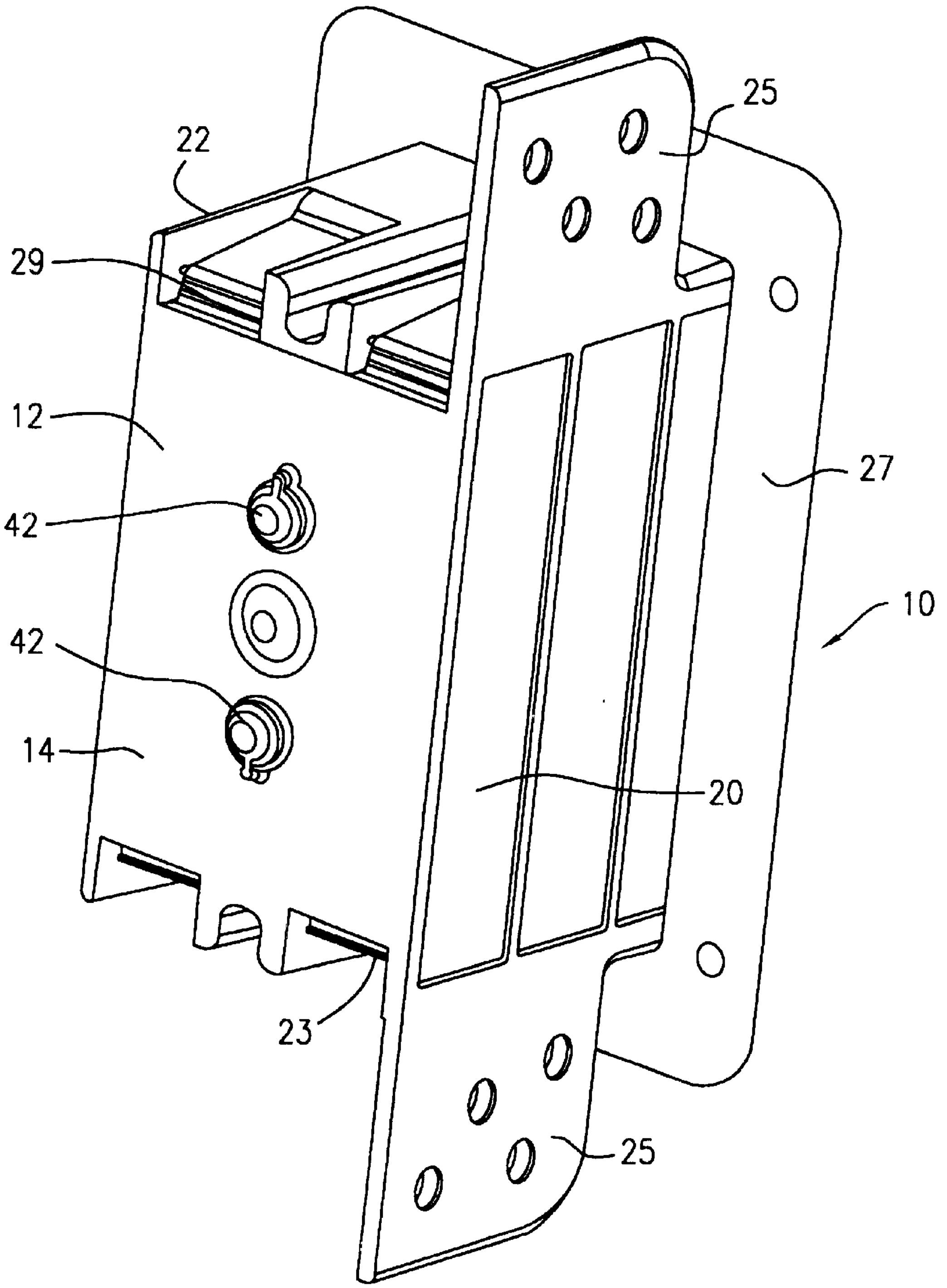
FIG. 3 is a rear perspective showing of the outlet box of FIG. 2.

Referring to FIGS. 1–3, the present invention includes an outlet box assembly 10. Assembly 10 includes a generally rectangular non-metallic plastic box 12 which includes a back wall 14, top and bottom walls 16 and 18, and opposed side walls 20 and 22. Box 12 has an open front face 24 defining a box interior 26. As it is commonly known in the electrical art, electrical terminations (not shown), such as switches and receptacles may be housed within the interior 26 of box 12.

In order to facilitate securing the box to a stud, the box assembly 10 further includes extending brackets 25 along side wall 20. Brackets 25 may be used to attach box 12 to the side of stud by use of fastener such as nails. In that regard, box 12 is referred to as a nail-on box.

Additionally, box 12 may include an extending frame 27 positioned inwardly from and perimetrically about open front face 24. Frame 27 also assists in mounting box 12 to a wall surface. Also, as well known in the box art, the wall 14 may include openings 29 to facilitate entry of wires into box 12. The opening 29 may be closed by retaining members 23 which captively receive the wires inserted into the box.

Figure 7:
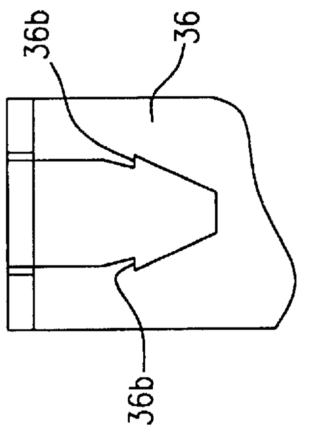
FIG. 7 is an enlarged showing of a portion of ground strap of FIG. 4.

Outlet box assembly 10 further supports a ground strap 30 also shown in more detail in FIGS. 4 through 7. The ground strap 30 is generally an L-shaped member formed of conductive metal having a first leg 32, a second leg 34 extending at a right angle thereto and a hook-shaped end portion 36. As shown in FIG. 1, first leg 32 is centrally positioned against the back wall 14 of box housing 12. The second leg 34 extends from the back wall towards the open front face 24 of box 12 along the interior surface 16a of top wall 16. The hook-shaped member 36 extends around the top wall 16 of box 12 in order to support ground strap 30 within box 12. As shown in FIG. 7, the depending end 36*a* of hook-shaped member 36 may include outwardly projecting barbs 36*b* for locking engagement into appropriate recess 16*b* on the top wall 16 of box 12 (FIG. 1) in order to further support ground strap 30 thereto.

Figure 4:
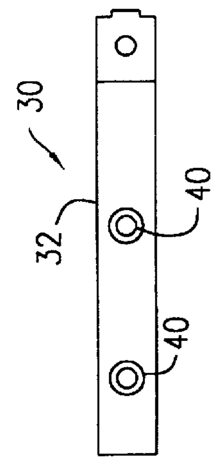
FIGS. 4, 5 and 6 show top, side and rear plan views respectively of the ground strap used in the outlet box assembly used in FIG. 1.
Figure 5:
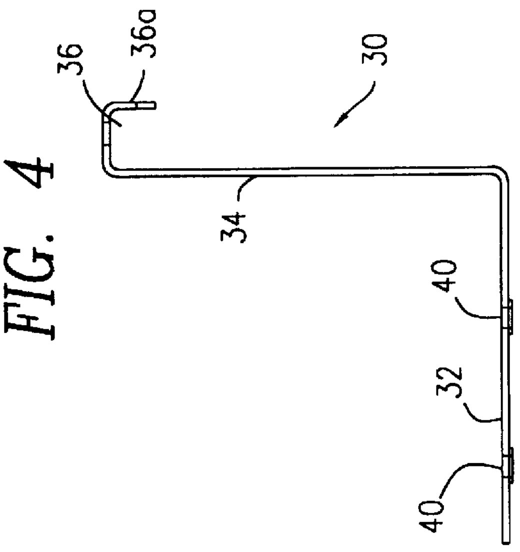
Figure 6:
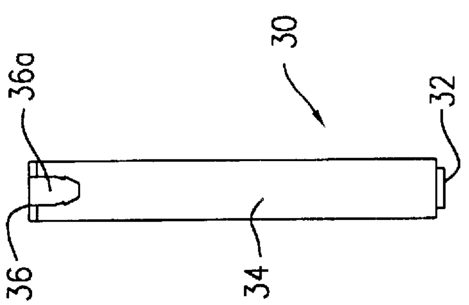

As shown in detail in FIGS. 3 and 4, first leg 32 of ground strap 30 includes a pair of spaced apart apertures 40 and 41 which are aligned with apertures 42 and 43 in the back wall 14 of box 12. Apertures 40, 41 and 42, 43 permit the accommodation of ground screws 50 thereinto. In that regard, either or both of apertures 40 and 41 may be internally screw threaded so as to engage the threads of ground screws 50 and 51 to support the ground screws thereat. Apertures 42 and 43 may include an outwardly projecting dimple 42*a*, 43*a* which also helps accommodate ground screws 50 and 51. Ground screws 50, inserted through one or both of apertures 40 and 41 of ground strap 30, also extend through apertures 42 and 43 of back wall 14 to help secure ground strap 30 to box housing 12.

The pair of ground screws 50 and 51 provided on the first leg 32 of ground strap 30 permit ground conductors to be separately accommodated by each of the ground screws. This allows greater freedom in attaching multiple devices within a single box. Ground conductors attached to either of ground screws 50 and 51 are in electrical continuity via ground strap 30. As an example, the ground conductor of the power wires extending into box 12 through opening 29 may be attached to one ground screw 50 while the ground wire from the termination device such as a switch or receptacle may be attached to the other ground screw 51. Thus, one of the ground screws need only accommodate a single wire. This is in distinction to the prior art devices having a single ground screw where multiple wires are required to be terminated by the single ground screw.

Various changes in modifications may be made to the invention, and it is intended to include all such changes and modifications as come within the scope of the invention and as set forth in the following claims.

What is claimed is:

1. An electrical outlet box for accommodating an electrical termination device comprising: a non-metallic outlet box housing having a back wall, a perimetrical sidewall and an open front end defining a box interior; an L-shaped metallic ground strap supported within said box interior, said ground strap having an elongate first leg supported on said back wall of said outlet box housing and a second leg supported on said sidewall, said elongate first leg including a pair of spaced apart mounting members in electrical continuity therethrough, said mounting members positioned to accommodate a ground wire of said electrical termination device, a distal end of said second leg includes a hook-shaped member positioned adjacent said open front end of said outlet box.

2. An electrical outlet box of claim 1 wherein said mounting member includes a pair of spaced apart apertures, each of which accommodates a ground screw therein which define said mounting members.

3. An electrical outlet box of claim 2 when said apertures are internally screw threaded.

4. An electrical outlet box of claim 1 wherein said perimetrical side wall includes a slot formed on an exterior surface thereof adjacent said open front end for accommodating said hook-shaped member.

5. An electrical outlet box of claim 4 wherein said hook-shaped member includes a barb extending therefrom for engagement with said exterior surface within said slot for securing said ground strap to said box housing.

* * * * *